United States Patent
Lee

(10) Patent No.: US 7,224,639 B2
(45) Date of Patent: May 29, 2007

(54) MULTI-PHASE CLOCK SIGNAL GENERATOR AND METHOD HAVING INHERENTLY UNLIMITED FREQUENCY CAPABILITY

(75) Inventor: Seonghoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/432,238

(22) Filed: May 10, 2006

(65) Prior Publication Data

US 2006/0203605 A1 Sep. 14, 2006

Related U.S. Application Data

(63) Continuation of application No. 11/027,376, filed on Dec. 29, 2004, now Pat. No. 7,106,655.

(51) Int. Cl.
*G11C 8/00* (2006.01)

(52) U.S. Cl. .................. 365/233; 365/193

(58) Field of Classification Search ............. 365/233, 365/193
See application file for complete search history.

(56) References Cited

U.S. PATENT DOCUMENTS

| | | | |
|---|---|---|---|
| 4,847,870 A | 7/1989 | Butcher | 375/87 |
| 5,544,203 A | 8/1996 | Casasanta et al. | 375/376 |
| 5,825,226 A | 10/1998 | Ferraiolo et al. | 327/250 |
| 5,844,954 A | 12/1998 | Casasanta et al. | 375/373 |
| 6,329,854 B1 | 12/2001 | Lee et al. | 327/158 |
| 6,337,590 B1 | 1/2002 | Millar | 327/158 |
| 6,366,148 B1 | 4/2002 | Kim | 327/262 |
| 6,466,058 B1 | 10/2002 | Goldman | 327/49 |
| 6,622,255 B1 | 9/2003 | Kurd et al. | 713/503 |
| 6,670,835 B2 | 12/2003 | Yoo | 327/158 |
| 6,724,228 B2 | 4/2004 | Kashiwazaki | 327/158 |
| 6,815,990 B2 | 11/2004 | Lee | 327/158 |
| 6,822,925 B2 * | 11/2004 | Van De Graaff | 365/233 |
| 6,850,458 B2 * | 2/2005 | Li | 365/233 |
| 6,867,627 B1 | 3/2005 | Murtagh | 327/158 |
| 2003/0117201 A1 | 6/2003 | Wang | 327/254 |
| 2005/0090215 A1 | 4/2005 | Cheng et al. | 455/180.3 |
| 2006/0023827 A1 | 2/2006 | Sanders et al. | 375/376 |

* cited by examiner

*Primary Examiner*—Michael Tran
(74) *Attorney, Agent, or Firm*—Dorsey & Whitney, LLP

(57) ABSTRACT

A delay-lock loop includes several delay lines, all but the first of which is composed of at least one variable delay unit that provides a fixed delay and a variable delay. The first delay line is composed of a plurality of fixed delay units, but no variable delay units. The remaining delay lines are each composed of different numbers of variable delay units to provide respective clock signals having different phases, but they do not include any of the fixed delay units. The first and a last delay line receive an input clock signal. Each of the remaining delay lines are coupled to an output of one of the fixed delay units depending on the number of variable delay units in the delay line so that the resulting clock signals have all been delayed the same number of fixed delay periods.

59 Claims, 12 Drawing Sheets

MULTI-PHASE CLOCK SIGNAL GENERATOR AND METHOD HAVING INHERENTLY UNLIMITED FREQUENCY CAPABILITY

CROSS-REFERENCE TO RELATED APPLICATION

This application is a continuation of U.S. patent application Ser. No. 11/027,376, filed Dec. 29, 2004 now U.S. Pat. No. 7,106,655.

TECHNICAL FIELD

This invention relates to clock generating systems and methods, and, more particularly, to a delay-lock loop and method for generating a multi-phased clock signal having a maximum operating frequency that is not limited by the minimum delay of voltage-controlled delay units used in the delay-lock loop.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal. The read data strobe signal typically has the same phase as the read data signals, and it is normally generated by the same memory device that is outputting the read data signals. Write data signals are typically latched into a memory device in synchronism with a write data strobe signal. The write data strobe signal should have a phase that is the quadrature of the write data signals so that a transition of the write data strobe signal occurs during a "data eye" occurring at the center of the period in which the write data signals are valid. The write strobe signal is typically generated by the memory controller from an internal clock signal that is derived from the system clock signal, and it is coupled to the memory device into which the data are being written. Unfortunately, the phase of the system clock signal is normally substantially the same as the phase of the write data signals. Therefore, it is necessary for the memory controller to generate the write data strobe signal as a quadrature signal having a phase that is 90-degrees relative to the phase of the internal clock signal. In other cases, a quadrature clock signal used for latching write data is generated in the memory device to which the data are being written. The quadrature clock signal is typically generated in the memory device from an internal clock signal that is also derived from the system clock signal.

Various techniques can be used and have been used by memory controllers and memory devices to generate a quadrature clock signal or write data strobe signal. If the frequency of the internal clock signal is fixed, a quadrature write strobe signal can be generated by a timing circuit that simply generates a transition of the write strobe signal a fixed time after a corresponding transition of the internal clock signal. However, synchronous memory devices are typically designed and sold to be operated over a wide range of clock frequencies. Therefore, it is generally not practical to use a fixed timing circuit to generate a write data strobe signal from the internal clock signal. Instead, a circuit that can adapt itself to an internal clock signal having a range of frequencies must be used.

Multi-phase clock signals are also required for applications other than for use as a write data strobe signal. For example, a "frequency doubler" circuit, which generates an output clock signal having twice the frequency of an input clock signal, can be implemented using an appropriate logic circuit that receives the input clock signal and quadrature versions of the input clock signal.

One conventional circuit that can generate multi-phase clock signals from an internal clock signal having a variable frequency is a delay-lock loop, such as the delay-lock loop 10 shown in FIG. 1. The delay-lock loop includes a tapped delay line 14 having four variable delay units ("VDUs") 16, 18, 20, 22 coupled in series with each other. Each of the VDUs 16–22 has an input, an output, and a control input "C". Each of the VDUs 16–22 couples a digital signal from its input I to its output with a delay corresponding to a delay control signal applied to its control input C. The input of the initial VDU 16 receives an internal clock signal iCLK. The outputs of all but the last VDU 22 is coupled to the input of the subsequent VDU 16–20. The output of each VDU 16–22 also forms a respective tap of the delay line 14 to provide four clock signals, CLK1–CLK4. As explained in greater detail below, the voltage-control provided by each of the VDUs 16–22 is composed of two components; a variable delay $t_v$ having a magnitude set by the control signal C and a fixed intrinsic delay $t_i$, which is the minimum delay by which a signal can be coupled through the VDU. The delay D of each of the VDUs 16–22 is thus defined by the formula:

$$D=D_I+D_V.$$

The total delay $D_T$ of the delay line 14, i.e., the delay of the CLK4 signal relative to the iCLK signal, is thus given by the formula:

$$D_T=4D_I+4D_V.$$

The CLK4 signal generated at the output of the final VDU 22 is also applied to one of two inputs to a phase detector ("PD") 26. The other input of the phase detector 26 receives the same iCLK signal that is applied to the input of the VDU 16. In operation, the phase detector 26 generates an error signal "E" at its output that is indicative of the lead or lag phase error of the CLK4 signal relative to the iCLK signal. The error signal E is applied to a VDU control unit 28, which generates a control signal that is applied to the control terminal C of the VDUs 16–22. The control signal adjusts the delay of the VDUs 16–22 to minimize the error signal and hence the phase error between the iCLK signal and the CLK4 signal. Therefore, the delays of the VDUs 16–22 are automatically adjusted until the phase of the iCLK signal is substantially equal to the phase of the CLK4 signal.

The operation of the delay-lock loop 10 will further be explained with reference to FIG. 2. The iCLK signal shown in the upper waveform is coupled through the first VDU 16 to produce the CLK1 signal shown in the second waveform of FIG. 2. The transition of the iCLK signal that produces the corresponding transition of the CLK1 signal are circled and linked to each other by a line in FIG. 2. Similarly, the indicated transition of the CLK1 signal is coupled through the VDU 18 to produce the indicated transition of the CLK2 signal, the indicated transition of the CLK2 signal is coupled through the VDU 20 to produce the indicated transition of the CLK3 signal, and the indicated transition of the CLK3 signal is coupled through the final VDU 22 to produce the indicated transition of the CLK4 signal. As previously explained, the delays of the VDUs 16–22 are automatically adjusted so that the iCLK signal has substantially the same phase at the CLK4 signal, which can be seen by comparing the iCLK signal shown in the top waveform of FIG. 2 to the CLK4 signal shown in the bottom waveform. All of the VDUs 16–22 are substantially identical to each other and they receive the same control signal so that they each provide the same delay. As can be observed from FIG. 2, since there are four VDUs 16–22 that together delay the iCLK signal by 360 degrees, each of the VDUs 16–22 delay the digital signal applied to its input by 90 degrees. The CLK1 signal thus has a phase of 90 degrees relative to the iCLK signal, the CLK2 signal thus has a phase of 180 degrees relative to the iCLK signal, the CLK3 signal has a phase of 270 degrees relative to the iCLK signal, and the CLK4 signal has the same phase as the iCLK signal.

The delay-lock loop 10 shown in FIG. 1 performs well over a wide range of frequencies in many instances. However, as will be explained with reference to FIGS. 3A and 3B, its high frequency range is limited by the intrinsic delay $D_I$ of each of the VDUs 16–22. With reference to FIG. 3A, as previously explained, each transition of the CLK4 signal is delayed from the corresponding edge of the iCLK signal by a total delay $D_T$ that is equal to the sum of the voltage-controlled delay $V_T$ and the intrinsic delay $I_T$. Each of these delays $V_T$ and $V_I$ are shown in FIG. 3A. The period P of the iCLK signal is equal to the total delay, i.e., $4D_V+4D_I$, and the frequency of the iCLK signal is the reciprocal of its period P, i.e., $1/(4D_V+4D_I)$. For example, if $4D_V$ is equal to 4 ns and $4D_I$ is equal to 1 ns, the frequency of the iCLK signal is 200 MHz, i.e., $1/(5*10^{-9})$.

The delay lock loop 10 can continue to lock the CLK4 signal to the iCLK signal increases by simply reducing the magnitude of the voltage-controlled delay $4D_V$ to reduce the total delay $D_T$. However, as shown in FIG. 3B, as the frequency of the iCLK signal continues to increase, the voltage-controlled delay $D_V$ is eventually reduced to zero. At this point, the total delay $D_T$ can no longer be reduced because the intrinsic delay $D_I$ is fixed. The maximum frequency of the iCLK signal to which the CLK4 signal can be locked to using the delay-lock loop 10 is thus the reciprocal of $4D_I$. Using the above example in which the total intrinsic delay $4D_I$ is 1 ns, the maximum frequency of the iCLK signal is 1 GHz.

The fixed intrinsic delay of delay lines used in conventional delay-lock loops can therefore severely limit the frequency range over which d loops can be used. There is therefore a need for a delay-lock loop having a frequency range that is not limited by the intrinsic delay of conventional delay lines.

SUMMARY OF THE INVENTION

A delay-lock loop is used to generate a plurality of clock signals having predetermined phases relative to each other using an input clock signal. The system and method includes at least three delay lines. A first delay line delays the input clock signal by a delay of $D_F$ to generate a first clock signal, where $D_F$ is a fixed delay time. A second delay line delays the input clock signal by a delay of $D_F+MD_V$ to generate a second clock signal. The delay $D_V$ is a variable delay time corresponding to a control signal applied to the second delay line, and M is the ratio of the phase of the second clock signal relative to the phase of the first clock signal. A third delay line delays the input clock signal by a delay of $D_F+D_V$, to generate a third clock signal. A phase detector compares the phase of the first clock signal with the phase of the third clock signal. Based on this comparison, the phase detector being generates the control signal. Portions of the delay lines may be common to each other, and the delay-lock loop may include an additional number of delay lines using a different number for M to generate additional clock signals having different phases.

DETAILED DESCRIPTION

Figure 4:
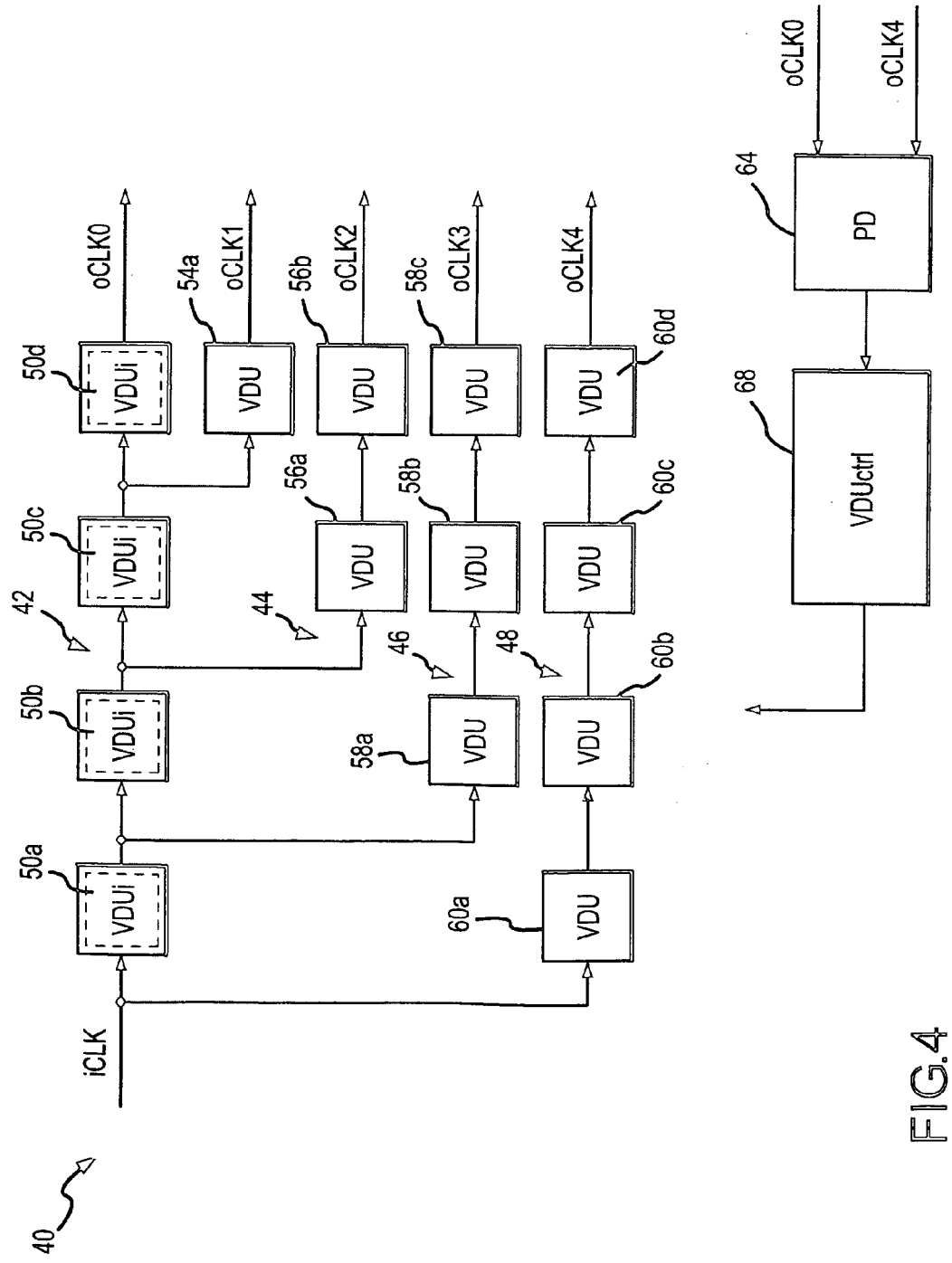
FIG. 4 is a block diagram of a delay-lock loop according to one embodiment of the invention.

One embodiment of a delay-lock loop 40 for generating multi-phase clock signals is shown in FIG. 4. The delay-lock loop 40 receives the internal clock signal iCLK, and couples it through four paths 42, 44, 46, 48, which generate CLK1, CLK2, CLK3 and CLK4 signals, respectively. The first path 42 includes four series coupled VDUs 50a–d, which have their control input coupled to a voltage to provide a zero voltage-controlled delay $D_V$. The VDUs 50a–d thus each provide a delay of only the intrinsic delay $D_I$, and they are therefore designated by the nomenclature VDUi 50a–d. The final VDUi 50d outputs a CLK0 signal, which is delayed by four times the intrinsic delay of each VDUi 50a–d, i.e., $4D_I$.

The output from the next-to-last VDUi 50c is coupled through a VDU 54a, which generates a CLK1 signal. The VDU 54a delays the signal from the output of the VDUi 50c by the sum of the voltage controlled delay $D_V$ and the intrinsic delay $D_I$. As a result, the CLK1 signal is delayed form the iCLK signal by four intrinsic delays and one variable delay, i.e., $4D_I+D_V$. In a similar manner, the iCLK signal is coupled through the VDUi 50a, the VDUi 50b, and two VDUs 56a,b to generate the CLK2 signal. The CLK2 signal is therefore delayed from the iCLK signal by four intrinsic delays and two variable delays, i.e., $4D_I+2D_V$. The iCLK signal is coupled through only one VDUi 50a and three VDUs 58a,b,c to generate the CLK3 signal. The CLK3 signal is therefore delayed from the iCLK signal by four intrinsic delays and three variable delays, i.e., $4D_I+3D_V$. Finally, the CLK4 signal is generated by coupling the iCLK signal through four VDUs 60a–d so that it is delayed from the iCLK signal by four intrinsic delays and four variable delays, i.e., $4D_I+4D_V$. The delay of each of the clock signals CLK0 relative to the iCLK signal is summarized in the following Table 1:

TABLE 1

| Signal | Delay |
|---|---|
| CLK0 | $4D_I$ |
| CLK1 | $4D_I + D_v$ |
| CLK2 | $4D_I + 2D_v$ |
| CLK3 | $4D_I + 3D_v$ |
| CLK4 | $4D_I + 4D_v$ |

Figure 1:
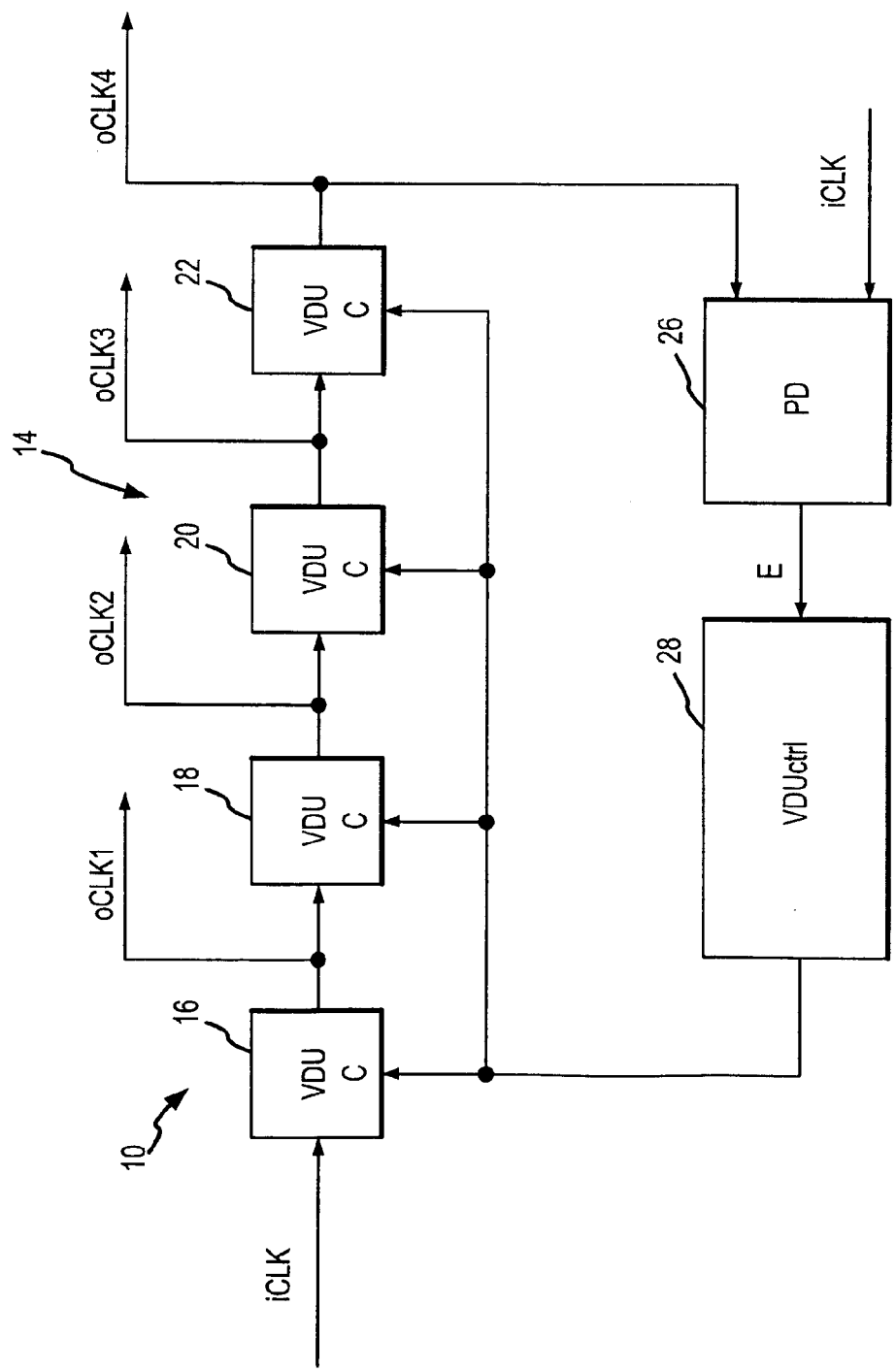
FIG. 1 is a block diagram of a typical delay-lock loop of conventional design.
Figure 2:
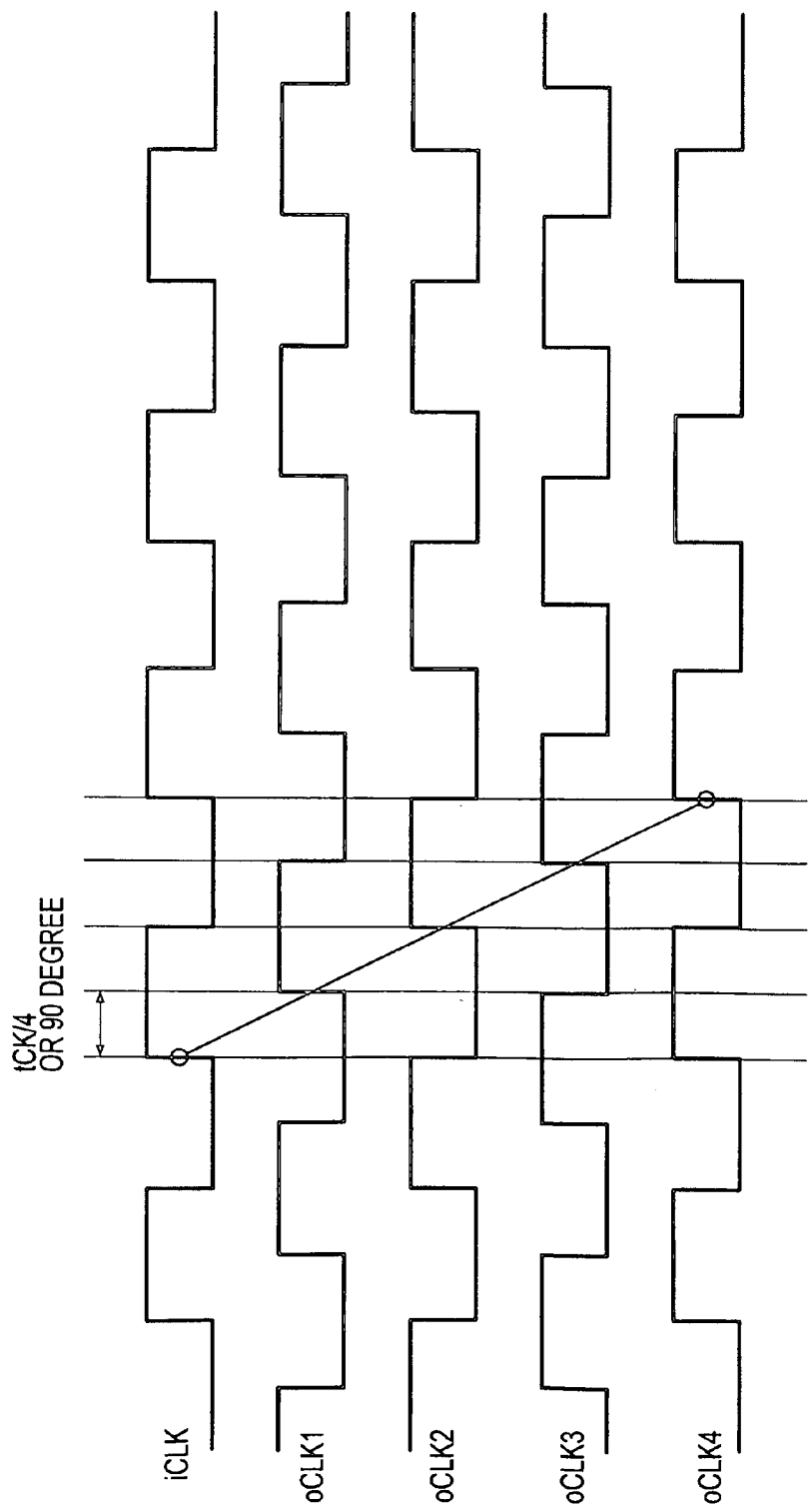
FIG. 2 is a timing diagram showing the operation of the delay-lock loop of FIG. 1.
Figure 3A:
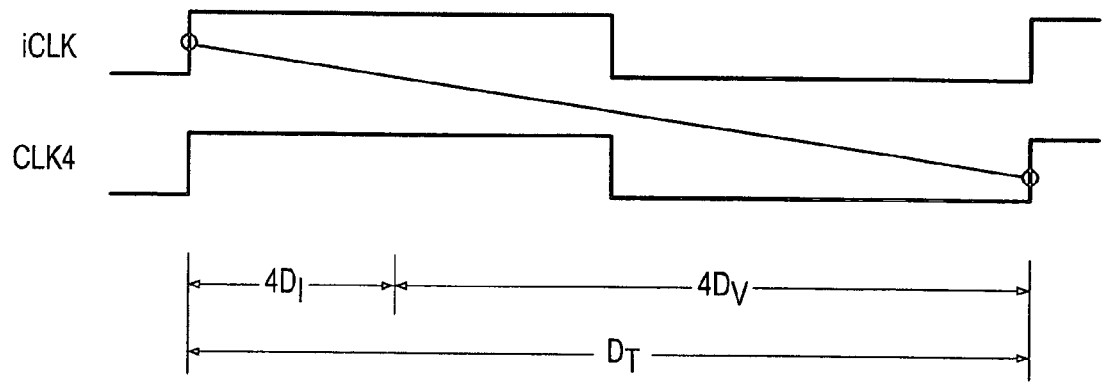
FIGS. 3A and 3B are timing diagram illustrating the manner in which the frequency range of the delay-lock loop of FIG. 1 is limited by the intrinsic delay of a delay line used in the delay-lock loop.
Figure 3B:
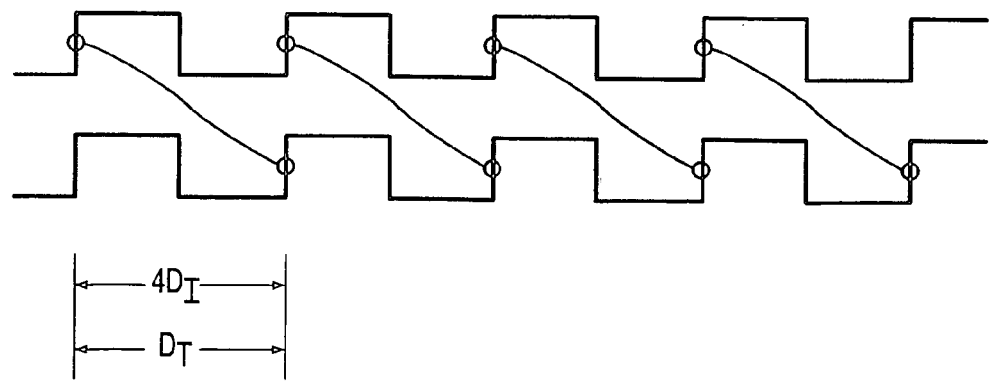

The CLK0 signal and the CLK4 signal are applied to a phase detector PD 64, which may be the same as the phase detector 26 used in the conventional delay-lock loop 10 of FIG. 1. Finally, the delay-lock loop 40 includes a VDU control unit 68 that receives an error signal E from the phase detector 64. The VDU control unit 68 may also be the same as the VDU control unit 28 used in the conventional delay-lock loop 10 of FIG. 1. The phase detector 64 and the VDU control unit 68 operate alone and together in the same manner as described above for the phase detector 26 and VDU control unit 60 used in the conventional delay-lock loop 10 of FIG. 1. As a result, the phase of the CLK0 signal is locked to the phase of the CLK4 signal, as shown in FIG. 5.

Figure 5:
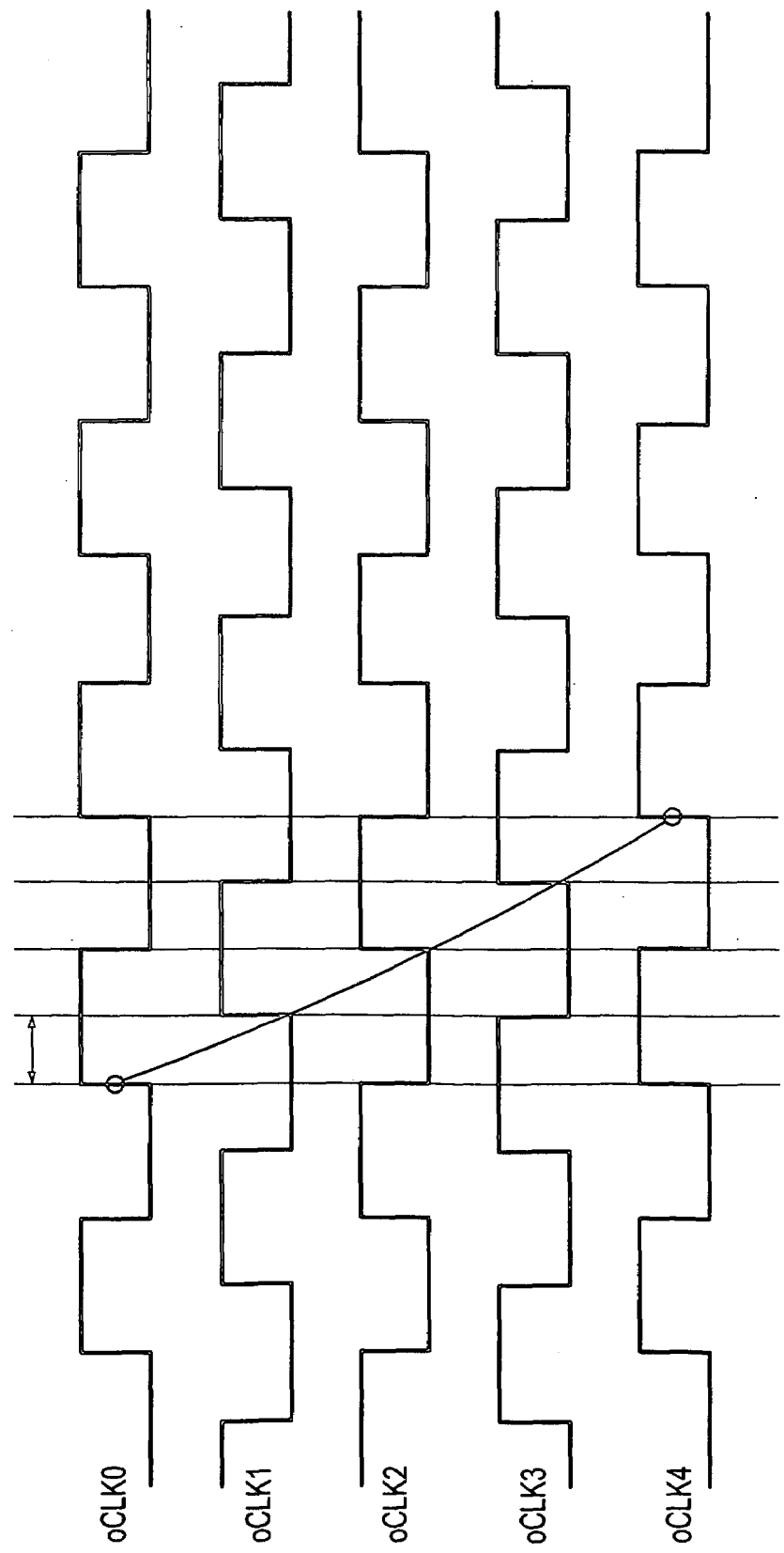
FIG. 5 is a timing diagram showing the operation of the delay-lock loop of FIG. 4.

It can be seen from FIG. 5 that the CLK0 signal is delayed from the iCLK signal by the sum of the intrinsic delays of the 50a–d, i.e., by $4D_I$. As also shown in FIG. 5, the CLK1 signal is delayed from the iCLK signal by $4Di+D_V$ so that it is delayed from the CLK0 signal by is delayed from the iCLK signal by $4Di+2D_V$ so that it is delayed from the CLK0 signal by 180 degrees. The CLK3 signal is delayed from the iCLK signal by $4Di+3D_V$ so that it is delayed from the CLK0 signal by 270 degrees. Finally, the CLK4 signal is delayed from the iCLK signal by $4Di+4D_V$ so that it is delayed from the CLK0 signal by 360 degrees. The CLK1–CLK4 signals are thus quadrature signals having transitions that are delayed from transitions of the iCLK signal by $4D_I$.

The phase detector 64 ensures that the phase of the CLK0 signal is equal to the phase of the CLK4 signal delayed by 360 degrees. Thus, $4D_I+360$ must equal $4D_I+4D_V$, which requires that $4D_V=360$ thereby making $D_V=90$. Significantly, the only requirement for the delay-lock loop 40 to operate is that it must be possible to reduce the voltage-controlled delay $D_V$ enough so that it is equal to one-quarter period of the iCLK signal. Since the voltage-controlled delay $D_V$ can be reduced to zero, the frequency of the iCLK signal can theoretically be infinity, although the components in the delay-lock loop 40 would be unable to operate above some frequency. However, the frequency limit of the delay-lock loop 40 is not limited by the intrinsic delays $D_I$ of the VDUs. In contrast, the phase detector 26 in the convention delay-lock loop 10 of FIG. 1 compared the CLK4 signal (which was delayed from the iCLK signal by $4D_I+4D_V$) with the iCLK signal. The phase detector 26 therefore ensured that the phase of the CLK4 signal be equal to the phase of the iCLK signal delayed by 360 degrees so that $4D_I+4D_V$ must equal 360. As a result, even if $D_V$ is zero, $4D_I$ can be equal to 360 (i.e., $D_I=90$) only as long as the intrinsic delay $D_I$ is less than one-quarter period of the iCLK signal.

Figure 6:
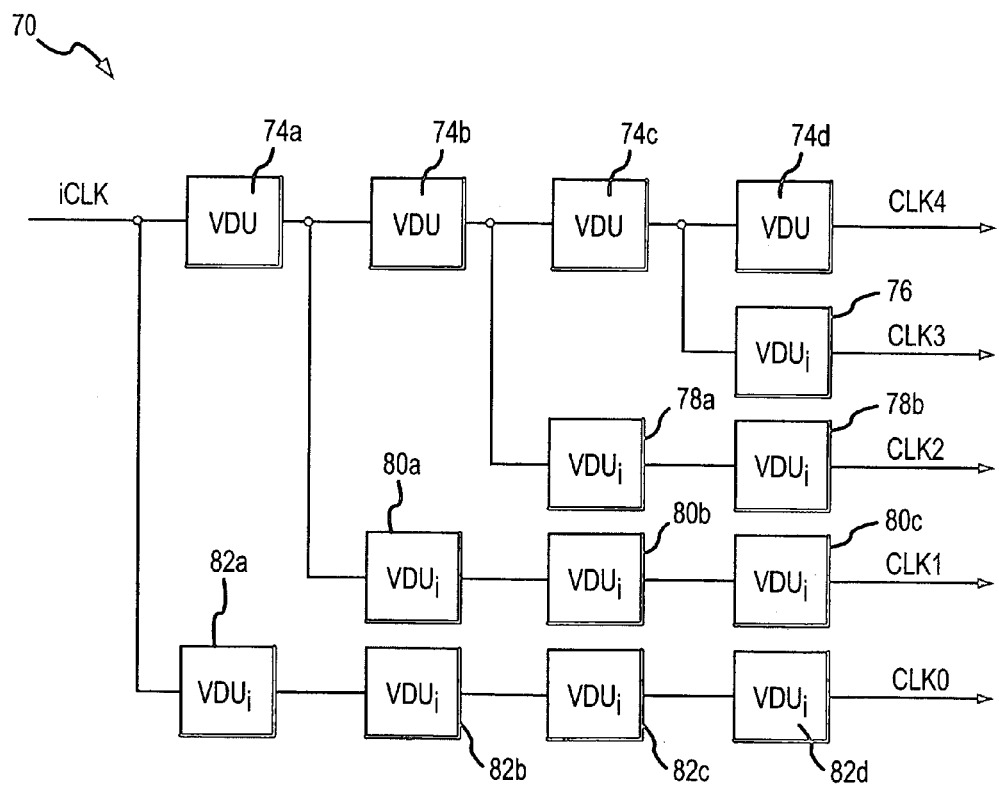
FIG. 6 is a block diagram of a delay-lock loop according to another embodiment of the invention.

Delay-lock loops that eliminate the limitations on operating frequency caused by intrinsic delays of delay elements can also be implemented using other VDU and VDUi arrangements. For example, with reference to FIG. 6, a delay-lock loop 70 couples the iCLK signal through four VDU's 74a–d to generate the CLK4 signal. Therefore, the CLK4 signal has a delay from the iCLK signal of $4D_I+4D_V$ just as in the delay-lock loop 40. The CLK3 signal is generated by coupling the output of the VDU 74c through a VDUi 76 so that it has a delay from the iCLK signal of $4D_I+3D_V$. Similarly, the CLK2 signal is generated by coupling the output of the VDU 74b through two VDUi's 78a,b so that it has a delay from the iCLK signal of $4D_I+2D_V$. The CLK1 signal is generated by coupling the output of the VDU 74a through three VDUi's 80a,b,c so that it has a delay from the iCLK signal of $4D_I+D_V$. Finally, CLK0 signal is generated by coupling the iCLK signal through four VDUi's 82a,b,c,d so that it has a delay from the iCLK signal of $4D_I$. The CLK0–CLK4 signals thus have the same delay from the iCLK signals as the CLK0–CLK4 signals generated by the delay-lock loop 40 shown in FIG. 4. The CLK0 signal and CLK4 signal are applied to the phase detector 64, which generates an error signal E to control the VDU control unit 68 in the same manner as explained above with reference to FIG. 4. The delay-lock loop 70 has the advantage of using fewer VDUs compared to the delay-lock loop 40 of FIG. 4, but is does so by using a greater number of VDUi's.

Figure 7:
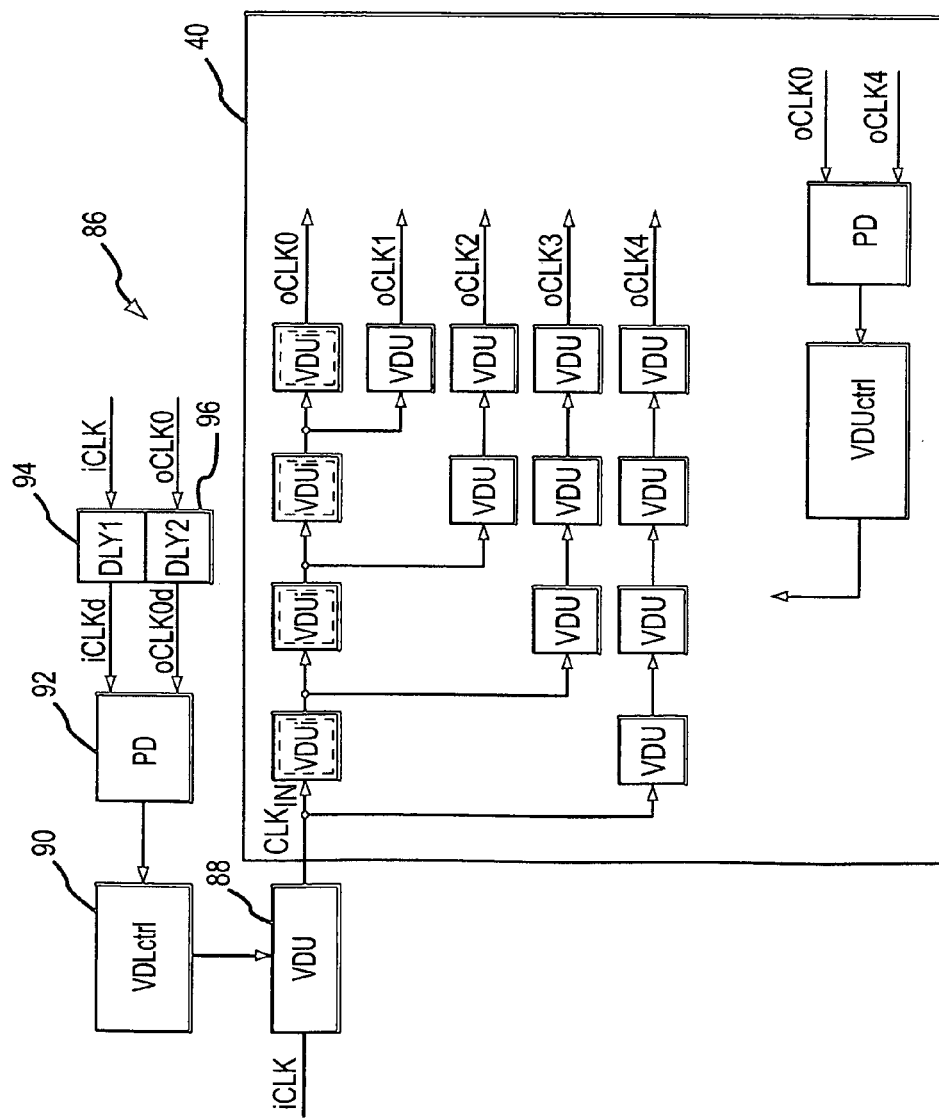
FIG. 7 is a block diagram of a delay-lock loop according to still another embodiment of the invention.

As can be seen in FIG. 5, although the delay-lock loop 40 generates quadrature clock signals CLK0–CLK4 from the iCLK signal, the transitions of the CLK0–CLK4 signals are not aligned with the transitions of the iCLK signal. Instead, they are delayed from the iCLK signal by $4D_I$, as previously explained. A delay-lock loop 86 according to another embodiment of the invention shown in FIG. 7 generates quadrature clock signals CLK0–CLK4 that have transitions that having any desired relationship to transitions of the iCLK signal, including being aligned with the transitions of the iCLK signal. The delay-lock loop 86 uses the delay-lock loop 40 shown in FIG. 4, and it operates in the same manner. However, instead of coupling the iCLK signal to the VDUs and VDUi's, the delay-lock loop first couples the iCLK signal through a VDU 88, which may be the same as or different from the VDUs used in the delay-lock loop 40. The VDU has a delay $D_I+D_V$ that is controlled by a VDU control unit 90, which is, in turn, controlled by a phase detector 92. One input of the phase detector 92 receives the iCLK signal after it has been coupled to a first delay unit 94, which provides a fixed delay, DLY1. The other input of the phase detector 92 receives the CLK0 signal after it has been coupled to a second delay unit 96, which provides a fixed delay DLY2 that may be equal to or different from the delay of the first delay unit 94.

The operation of the delay-lock loop 86 will be initially explained with the assumption that the delays DLY1, DLY2 of the delay lines 94, 96, respectively, are equal to each other. Therefore, after the CLKIN signal is delayed by the 4 VDUi's to provide the CLK0 signal, the CLK0 signal will have the same phase as the iCLK signal. This is accomplished by the phase detector 92 and VDU control unit 90 adjusting the delay of the VDU 88 so that it is equal to the period of the iCLK signal less $4D_f$.

The phase relationship between the CLK0 signal and the iCLK signal can be adjusted in any manner desired by selecting delays DLY1, DLY2 of the delay lines 94, 96, respectively, so that they are not equal to each other. If DLY1 is greater than DLY2, the iCLK signal will lead the CLK0 signal. If DLY1 is less than DLY2, the iCLK signal will lag the CLK0 signal.

Figure 8:
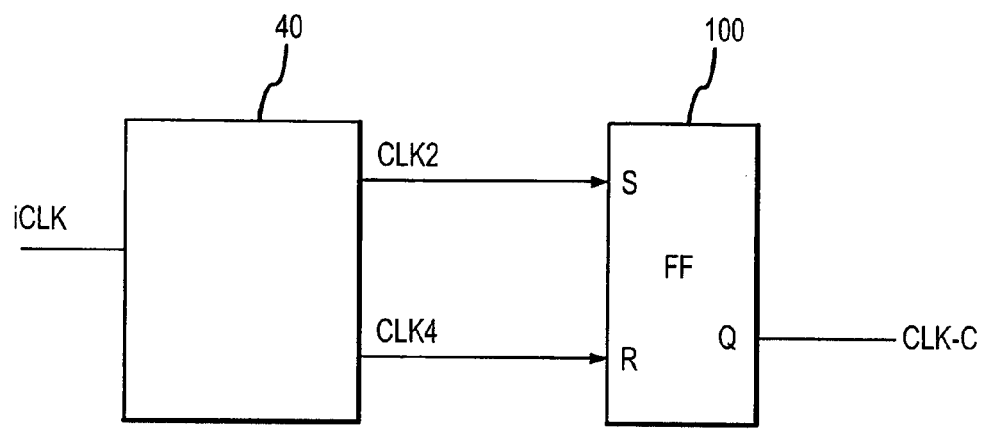
FIG. 8 is a block diagram of a duty cycle correction circuit using the multi-phase clock signals generated by the delay-lock loops of FIG. 4, 6 or 7 or a delay-lock loop according to some other embodiment of the invention.
Figure 9:
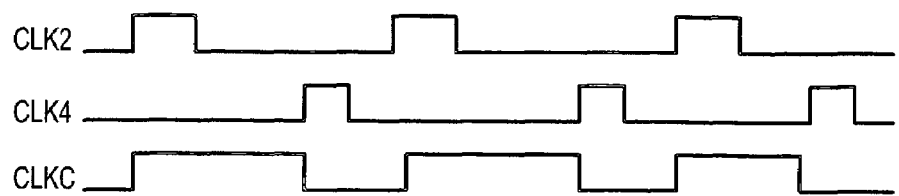
FIG. 9 are timing diagrams showing the operation of the duty cycle correction circuit of FIG. 8.

Delay-lock loops according various embodiments of the invention can be used to generate other signals, such as a duty cycle corrected signal or a multiple of the iCLK signal. For example, with reference to FIG. 8, the delay-lock loop 40 of FIG. 4 may be used with a set-reset flip-flop 100 to provide a duty cycle corrected version of the iCLK signal. It can be seen from FIG. 9 that the iCLK signal does not have a 50% duty cycle. The CLK2 signal from the delay-lock loop 40 is applied to the set input "S" of the flip-flop 100, and the CLK4 signal from the delay-lock loop 40 is applied to the reset input "R" of the flip-flop 100. As a result, the output "Q" of the flip-flop 100 transitions high responsive to the CLK2 signal at a phase of 180 degrees relative to the transition of the "Q" output low responsive to the CLK4 signal. The resulting signal CLK-C has the same frequency as the iCLK signal, but its duty cycle has been corrected to 50%. Although the delay-lock loop of FIGS. 4, 6 or 7, or a delay-lock loop according to some other embodiment of the invention, can be used to correct the duty cycle of a signal as shown in FIGS. 8 and 9, an embodiment of a delay-lock loop according to the present invention having only two VDUs generating only two clock signals phases 180 degrees from each other can also be used.

Figure 10:
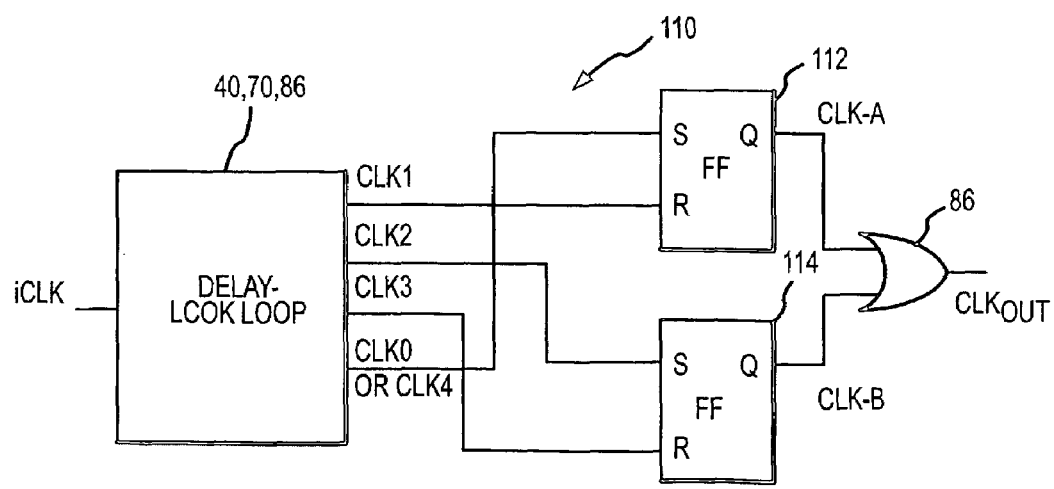
FIG. 10 is a block diagram of a frequency doubler circuit using the multi-phase clock signals generated by the delay-lock loops of FIG. 4, 6 or 7 or a delay-lock loop according to some other embodiment of the invention.
Figure 11:
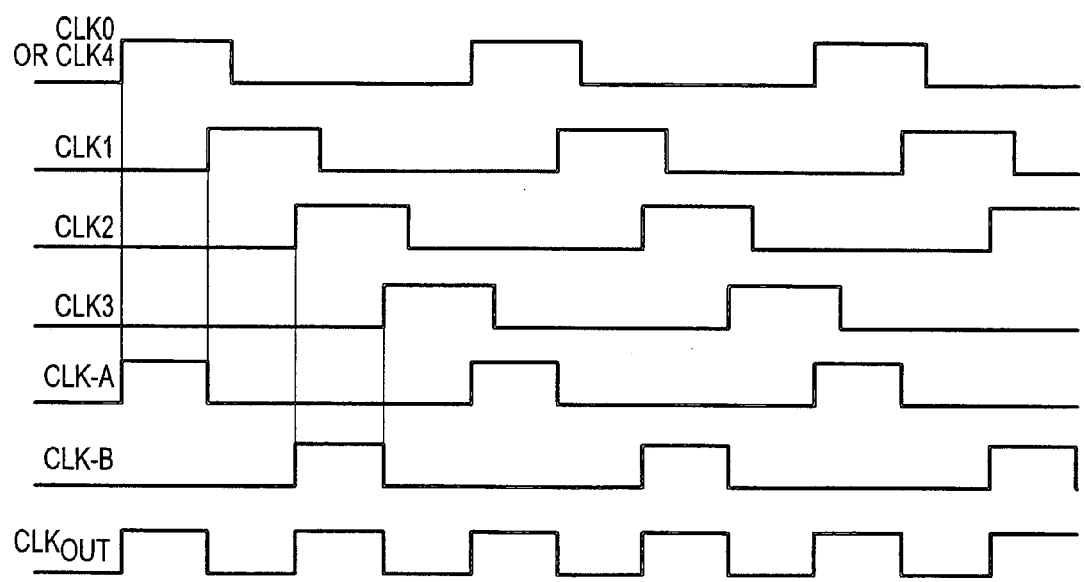
FIG. 11 is a timing diagram showing the operation of the frequency doubler circuit of FIG. 10.

As mentioned above, various embodiments of the invention can be used to generate clock signals having frequencies that are a multiple of the frequency of the frequency of the iCLK signal. With reference to FIG. 10, a frequency doubler circuit 110 uses either the delay-lock loop 40, 70, 86 shown in FIG. 4, 6 or 7, respectively, or some other embodiment of a delay-lock loop according to the present invention to generate four clock signals CLK1, CLK2, CLK3, CLK4, which are phased 90 degrees from each other. The frequency doubler circuit 110 further includes a pair of set/reset flip-flops 112, 114 that are coupled to receive the clock signals from the delay-lock loop 40, 70 or 86. The first flip-flop 112 is set by the CLK4 signal and reset by the CLK1 signal. The clock signal CLK-A at the output of the flip-flop 112 is therefore a signal that transitions high at 360 (or 0) degrees and transitions low at 90 degrees, as shown in FIG. 11. Similarly, the second flip-flop 114 is set by the CLK2 signal and reset by the CLK3 signal. The clock signal CLK-B at the output of the flip-flop 114 is therefore a signal that transitions high at 180 degrees and transitions low at 270 degrees. The outputs of the flip-flops 112, 114 are combined by an OR gate 116 to generate a $CLK_{OUT}$ signal that has twice the frequency of the iCLK signal. Moreover, the $CLK_{OUT}$ signal will always have a 50% duty cycle.

Delay-lock loops according to various embodiments of the present invention can be used for a variety of purposes in electronic devices, such as memory devices. For example, with reference to FIG. 12, a synchronous dynamic random access memory ("SDRAM") 200 includes a command decoder 204 that controls the operation of the SDRAM 200 responsive to high-level command signals received on a control bus 206 and coupled thorough input receivers 208. These high level command signals, which are typically generated by a memory controller (not shown in FIG. 12), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 12). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Figure 12:
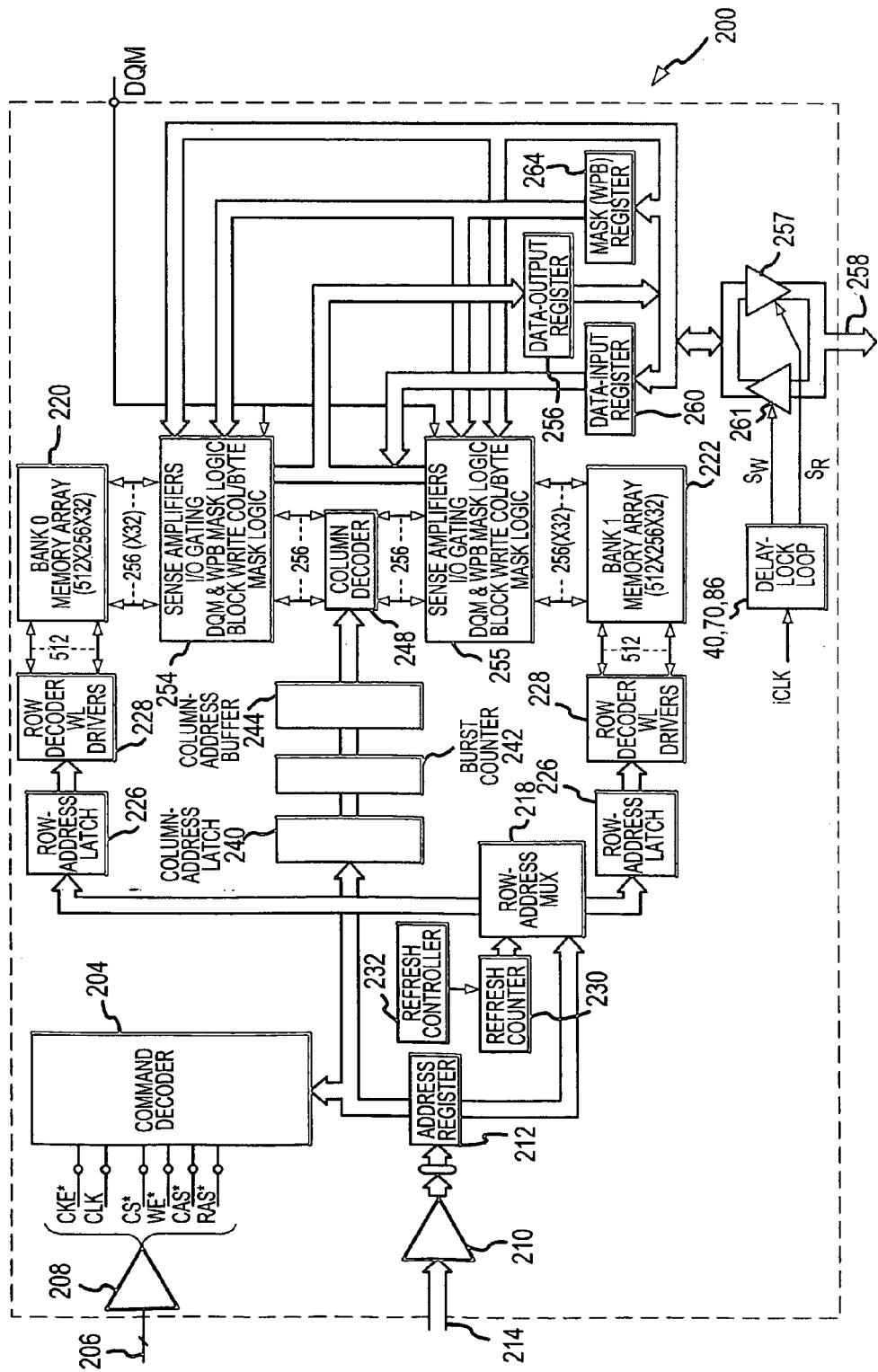
FIG. 12 is a block diagram of a memory device using multi-phase clock signals generated by the delay-lock loop of FIG. 4, 6 or 7 or a delay-lock loop according to some other embodiment of the invention.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe signal $S_R$ generated by the delay line 40, 70 or 86, or some other embodiments of a delay line in accordance with the present invention. The SDRAM 200 shown in FIG. 12 is a double data rate ("DDR") SDRAM that inputs or outputs data twice each clock period. The delay line 40, 70 or 86 receives the periodic iCLK signal and generates the read data strobe $S_R$ responsive to the CLK4 signal and the CLK2 signal, which are generated as explained above. As a result, the read data are coupled to the data bus 258 in substantially in phase with the iCLK signal and 180 degrees from the phase of the iCLK signal or some other selected phase with respect to the iCLK signal.

Data to be written to one of the arrays 220, 222 are coupled from the data bus 258 through data input receivers 261 to a data input register 260. The data input receivers 261 couple the write data from the data bus 258 responsive to a write data strobe signal $S_W$ generated responsive to CLK1 and CLK3 signals, which are generated by the delay-lock loop 40, 70 or 86 or some other embodiment of a delay-lock loop in accordance with the present invention. As a result, the write data are coupled into the SDRAM 200 from the data bus 258 at the center of a "data eye" corresponding to the phase of the iCLK signal. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 13:
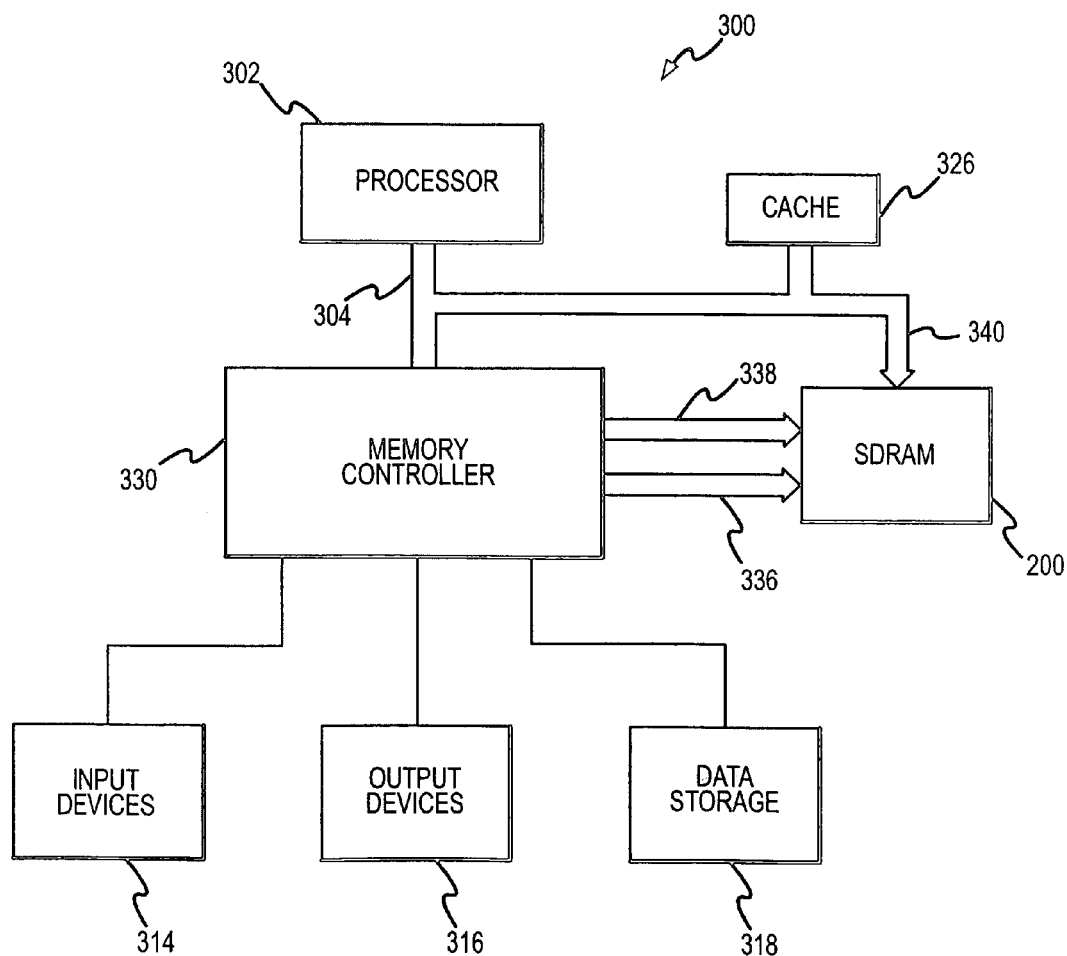
FIG. 13 is a block diagram of a processor-based system using the memory device of FIG. 12.

The SDRAM 200 shown in FIG. 12 can be used in various electronic systems. For example, it may be used in a processor-based system, such as a computer system 300 shown in FIG. 13. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically couple to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, different numbers of VDU can be used to generate any number of clock signals having any desired phase relationship to each other. Accordingly, the invention is not limited except as by the appended claims.

We claim:

1. A delay-lock loop whose operating frequency is unconstrained by intrinsic delay, the delay-lock ioop comprising:
a first delay line having an intrinsic delay and a voltage controlled delay, the first delay line receiving an input clock signal and generating a first clock signal;
a second delay line having an intrinsic delay and a voltage controlled delay, the second delay line receiving the input clock signal and generating a second clock signal;
a third delay line having an intrinsic delay and a voltage controlled delay, the third delay line receiving the input clock signal and generating a third clock signal; and
wherein the intrinsic delays of the first, second and third delay lines are substantially the same, but the voltage controlled delays of the first, second and third delay lines are substantially different from each other.

2. The delay-lock loop of claim 1 wherein each of the first, second and third delay lines contain a same number of delay units.

3. The delay-lock loop of claim 1 wherein the first delay line imposes zero voltage controlled delay.

4. The delay-lock loop of claim 1 wherein the second clock signal has a second predetermined phase relative to the first clock signal.

5. The delay-lock loop of claim 4 wherein the second predetermined phase is 90 degrees.

6. The delay-lock ioop of claim 4 wherein the second predetermined phase is 180 degrees.

7. The delay-lock ioop of claim 1 wherein the second predetermined phase is 270 degrees.

8. The delay-lock loop of claim 1 wherein the third clock signal has a same phase as the first clock signal.

9. The delay-lock loop of claim 1 further comprising a phase detector receiving the first clock signal and the third clock signal, the phase detector being operable to generate a control signal corresponding to a difference between the phase of the first clock signal and the phase of the third clock signal.

10. The delay-lock loop of claim 9 wherein the second delay line receives the control signal and wherein the voltage controlled delay imposed by the second delay line is determined in part based on the control signal.

11. The delay-lock loop of claim 1 wherein at least a portion of at least one of the first, second and third delay lines is common to at least a portion of at least one of the other of the first, second and third delay lines.

12. The delay-lock loop of claim 1 further comprising:
a fourth delay line receiving the input clock signal and generating a fourth clock signal;
a fifth delay line receiving the input clock signal and generating a fifth clock signal; and
wherein the first, second, third, fourth, and fifth delay lines each have the same intrinsic delay, but each of the first, second, third, fourth, and fifth delay lines impose a different voltage controlled delay on the input clock signal.

13. The delay-lock loop of claim 12 wherein the second clock signal has a 90 phase relative to the first clock signal, the third clock signal has a 180 degree phase relative to the first clock signal, the fourth clock signal has a 270 degree phase relative to the first clock signal and the fifth clock signal has a 360 degree phase relative to the first clock signal.

14. The delay-lock loop of claim 12 wherein the first, second, third, fourth and fifth delay lines each contain a same number of delay units.

15. The delay-lock loop of claim 12 further comprising a phase detector receiving the first clock signal and the fifth clock signal, the phase detector being operable to generate a control signal corresponding to a difference between the phase of the first clock signal and the phase of the fifth clock signal.

16. The delay lock loop of claim 15 wherein the second, third, and fourth delay lines receive the control signal and the voltage-controlled delay imposed by each of the second, third and fourth delay lines is determined in part based on the control signal.

17. The delay-lock loop of claim 1 wherein:
the first delay line comprises first, second, third and fourth fixed delay units coupled in series;
the second delay line comprises the first, second and third fixed delay units coupled in series with a first variable delay unit;

the third delay line comprises the first and second fixed delay units coupled in series with second and third variable delay units;

the fourth delay line comprises the first fixed delay unit coupled in series with fourth, fifth, and sixth variable delay units; and the fifth delay line comprises seventh, eighth, ninth and tenth variable delay units coupled in series.

18. The delay-lock loop of claim 17 wherein each of the fixed delay units has a same intrinsic delay as each of the variable delay units.

19. The delay-lock loop of claim 1 wherein the first delay line comprises first, second, third and fourth variable delay units coupled in series;

the second delay line comprises the first, second and third variable delay units coupled in series with a first fixed delay unit;

the third delay line comprises the first and second variable delay units coupled in series with second and third fixed delay units;

the fourth delay line comprises the first variable delay unit coupled in series with fourth, fifth, and sixth fixed delay units; and the fifth delay line comprises seventh, eighth, ninth and tenth fixed delay units coupled in series.

20. A memory device comprising:
a row address circuit operable to receive and decode row address signals applied to external address terminals of the memory device;
a column address circuit operable to receive and decode column address signals applied to the external address terminals;
a memory cell array operable to store data written to and read from the array at a location determined by the decoded row address signals and the decoded column address signals
a read data path circuit operable to couple read data signals from the memory cell array to external data terminals of the memory device;
a write data path circuit operable to couple write data signals from the external data terminals of the memory device to the memory cell array;
a command decoder operable to decode a plurality of command signals applied to respective external command terminals of the memory device, the command decoder being operable to generate control signals corresponding to the decoded command signals; and
a delay-lock loop operable to generate either the write data strobe signal or the read data strobe signal from an internal clock signal, the delay-lock loop comprising:
a first delay line having an intrinsic delay and a voltage controlled delay, the first delay line receiving an input clock signal and generating a first clock signal;
a second delay line having an intrinsic delay and a voltage controlled delay, the second delay line receiving the input clock signal and generating a second clock signal;
a third delay line having an intrinsic delay and a voltage controlled delay, the third delay line receiving the input clock signal and generating a third clock signal; and
wherein the intrinsic delays of the first, second and third delay lines are substantially the same, but the voltage controlled delays of the first, second and third delay lines are substantially different from each other.

21. The memory device of claim 20 wherein each of the first, second and third delay lines contain a same number of delay units.

22. The memory device of claim 20 wherein the first delay line imposes zero voltage controlled delay.

23. The memory device of claim 20 wherein the second clock signal has a second predetermined phase relative to the first clock signal.

24. The memory device of claim 23 wherein the second predetermined phase is 90 degrees.

25. The memory device of claim 23 wherein the second predetermined phase is 180 degrees.

26. The memory device of claim 23 wherein the second predetermined phase is 270 degrees.

27. The memory device of claim 20 wherein the third clock signal has a same phase as the first clock signal.

28. The memory device of claim 20 wherein the delay-lock loop further comprises a phase detector receiving the first clock signal and the third clock signal, the phase detector being operable to generate a control signal corresponding to a difference between the phase of the first clock signal and the phase of the third clock signal.

29. The memory device of claim 28 wherein the second delay line receives the control signal and wherein the voltage controlled delay imposed by the second delay line is determined in part based on the control signal.

30. The memory device of claim 20 wherein at least a portion of at least one of the first, second and third delay lines is common to at least a portion of at least one of the other of the first, second and third delay lines.

31. The memory device of claim 20 further comprising:
a fourth delay line receiving the input clock signal and generating a fourth clock signal;
a fifth delay line receiving the input clock signal and generating a fifth clock signal; and
wherein the first, second, third, fourth, and fifth delay lines each have the same intrinsic delay, but each of the first, second, third, fourth, and fifth delay lines impose a different voltage controlled delay on the input clock signal.

32. The memory device of claim 31 wherein the second clock signal has a 90 phase relative to the first clock signal, the third clock signal has a 180 degree phase relative to the first clock signal, the fourth clock signal has a 270 degree phase relative to the first clock signal and the fifth clock signal has a 360 degree phase relative to the first clock signal.

33. The memory device of claim 31 wherein the first, second, third, fourth and fifth delay lines each contain a same number of delay units.

34. The memory device of claim 31 further comprising a phase detector receiving the first clock signal and the fifth clock signal, the phase detector being operable to generate a control signal corresponding to a difference between the phase of the first clock signal and the phase of the fifth clock signal.

35. The memory device of claim 34 wherein the second, third, and fourth delay lines receive the control signal and the voltage-controlled delay imposed by each of the second, third and fourth delay lines is determined in part based on the control signal.

36. The memory device of claim 20 wherein:
the first delay line comprises first, second, third and fourth fixed delay units coupled in series;
the second delay line comprises the first, second and third fixed delay units coupled in series with a first variable delay unit;
the third delay line comprises the first and second fixed delay units coupled in series with second and third variable delay units;

the fourth delay line comprises the first fixed delay unit coupled in series with fourth, fifth, and sixth variable delay units; and the fifth delay line comprises seventh, eighth, ninth and tenth variable delay units coupled in series.

37. The memory device of claim 36 wherein each of the fixed delay units has a same intrinsic delay as each of the variable delay units.

38. The memory device of claim 20 wherein the first delay line comprises first, second, third and fourth variable delay units coupled in series;

the second delay line comprises the first, second and third variable delay units coupled in series with a first fixed delay unit;

the third delay line comprises the first and second variable delay units coupled in series with second and third fixed delay units;

the fourth delay line comprises the first variable delay unit coupled in series with fourth, fifth, and sixth fixed delay units; and the fifth delay line comprises seventh, eighth, ninth and tenth fixed delay units coupled in series.

39. The memory device of claim 20 wherein the memory cell array comprises a dynamic random access memory cell array.

40. A processor-based system comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive and decode row address signals applied to external address terminals of the memory device;
a column address circuit operable to receive and decode column address signals applied to the external address terminals; and
a memory device, comprising:
a row address circuit operable to receive and decode row address signals applied to external address terminals of the memory device;
a column address circuit operable to receive and decode column address signals applied to the external address terminals;
a memory cell array operable to store data written to and read from the array at a location determined by the decoded row address signals and the decoded column address signals;
a read data path circuit operable to couple read data signals from the array to external data terminals of the memory device;
a write data path circuit operable to couple write data signals from the external data terminals of the memory device to the array;
a command decoder operable to decode a plurality of command signals applied to respective external command terminals of the memory device, the command decoder being operable to generate control signals corresponding to the decoded command signals; and
a delay-lock loop operable to generate either the write data strobe signal or the read data strobe signal from an internal clock signal, the delay-lock loop comprising:

a first delay line having an intrinsic delay and a voltage controlled delay, the first delay line receiving an input clock signal and generating a first clock signal;
a second delay line having an intrinsic delay and a voltage controlled delay, the second delay line receiving the input clock signal and generating a second clock signal;
a third delay line having an intrinsic delay and a voltage controlled delay, the third delay line receiving the input clock signal and generating a third clock signal; and
wherein the intrinsic delays of the first, second and third delay lines are substantially the same, but the voltage controlled delays of the first, second and third delay lines are substantially different from each other.

41. The processor-based system of claim 40 wherein each of the first, second and third delay lines contain a same number of delay units.

42. The processor-based system of claim 40 wherein the first delay line imposes zero voltage controlled delay.

43. The processor-based system of claim 40 wherein the second clock signal has a second predetermined phase relative to the first clock signal.

44. The processor-based system of claim 43 wherein the second predetermined phase is 90 degrees.

45. The processor-based system of claim 43 wherein the second predetermined phase is 180 degrees.

46. The processor-based system of claim 43 wherein the second predetermined phase is 270 degrees.

47. The processor-based system of claim 40 wherein the third clock signal has a same phase as the first clock signal.

48. The processor-based system of claim 40 wherein the delay-lock loop further comprises a phase detector receiving the first clock signal and the third clock signal, the phase detector being operable to generate a control signal corresponding to a difference between the phase of the first clock signal and the phase of the third clock signal.

49. The processor-based system of claim 48 wherein the second delay line receives the control signal and wherein the voltage controlled delay imposed by the second delay line is determined in part based on the control signal.

50. The processor-based system of claim 40 wherein at least a portion of at least one of the first, second and third delay lines is common to at least a portion of at least one of the other of the first, second and third delay lines.

51. The processor-based system of claim 40 further comprising:
a fourth delay line receiving the input clock signal and generating a fourth clock signal;
a fifth delay line receiving the input clock signal and generating a fifth clock signal; and
wherein the first, second, third, fourth, and fifth delay lines each have the same intrinsic delay, but each of the first, second, third, fourth, and fifth delay lines impose a different voltage controlled delay on the input clock signal.

52. The processor-based system of claim 51 wherein the second clock signal has a 90 phase relative to the first clock signal, the third clock signal has a 180 degree phase relative to the first clock signal, the fourth clock signal has a 270 degree phase relative to the first clock signal and the fifth clock signal has a 360 degree phase relative to the first clock signal.

53. The processor-based system of claim 51 wherein the first, second, third, fourth and fifth delay lines each contain a same number of delay units.

54. The processor-based system of claim 51 further comprising a phase detector receiving the first clock signal and the fifth clock signal, the phase detector being operable to generate a control signal corresponding to a difference between the phase of the first clock signal and the phase of the fifth clock signal.

55. The processor-based system of claim 54 wherein the second, third, and fourth delay lines receive the control signal and the voltage-controlled delay imposed by each of the second, third and fourth delay lines is determined in part based on the control signal.

56. The processor-based system of claim 40 wherein:
the first delay line comprises first, second, third and fourth fixed delay units coupled in series;
the second delay line comprises the first, second and third fixed delay units coupled in series with a first variable delay unit;
the third delay line comprises the first and second fixed delay units coupled in series with second and third variable delay units;
the fourth delay line comprises the first fixed delay unit coupled in series with fourth, fifth, and sixth variable delay units; and
the fifth delay line comprises seventh, eighth, ninth and tenth variable delay units coupled in series.

57. The processor-based system of claim 56 wherein each of the fixed delay units has a same intrinsic delay as each of the variable delay units.

58. The processor-based system of claim 40 wherein the first delay line comprises first, second, third and fourth variable delay units coupled in series;
the second delay line comprises the first, second and third variable delay units coupled in series with a first fixed delay unit;
the third delay line comprises the first and second variable delay units coupled in series with second and third fixed delay units;
the fourth delay line comprises the first variable delay unit coupled in series with fourth, fifth, and sixth fixed delay units; and
the fifth delay line comprises seventh, eighth, ninth and tenth fixed delay units coupled in series.

59. The processor-based system of claim 40 wherein the memory cell array comprises a dynamic random access memory cell array.

\* \* \* \* \*